United States Patent
Oka et al.

(10) Patent No.: US 7,870,526 B2
(45) Date of Patent: Jan. 11, 2011

(54) AID APPARATUS, COMPUTER-READABLE RECORDING MEDIUM IN WHICH DESIGN AID PROGRAM IS STORED, AND INTERACTIVE DESIGN AID APPARATUS

(75) Inventors: Tsuneo Oka, Kawasaki (JP); Akira Mimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 614 days.

(21) Appl. No.: 11/961,042

(22) Filed: Dec. 20, 2007

(65) Prior Publication Data

US 2008/0201679 A1    Aug. 21, 2008

(30) Foreign Application Priority Data

Feb. 20, 2007  (JP)  ............... 2007-039943

(51) Int. Cl.
   *G06F 17/50*   (2006.01)
(52) U.S. Cl. ........................... 716/11; 716/1
(58) Field of Classification Search ............... None
   See application file for complete search history.

(56) References Cited

U.S. PATENT DOCUMENTS

| | | | | |
|---|---|---|---|---|
| 5,164,908 A | * | 11/1992 | Igarashi | 716/11 |
| 5,745,371 A | * | 4/1998 | Shouen | 716/15 |
| 6,002,399 A | * | 12/1999 | Haine et al. | 715/763 |
| 6,243,101 B1 | * | 6/2001 | Erskine | 345/619 |
| 6,304,790 B1 | * | 10/2001 | Nakamura et al. | 700/97 |
| 7,363,610 B2 | * | 4/2008 | Alfieri | 716/18 |
| 2006/0041853 A1 | * | 2/2006 | Kawasaki et al. | 716/11 |
| 2008/0092089 A1 | * | 4/2008 | Kobayashi | 716/1 |

FOREIGN PATENT DOCUMENTS

| | | |
|---|---|---|
| JP | 3-121568 | 5/1991 |
| JP | 7-44589 | 2/1995 |
| JP | 10-134092 | 5/1998 |

* cited by examiner

*Primary Examiner*—Leigh Marie Garbowski
(74) *Attorney, Agent, or Firm*—Staas & Halsey LLP

(57) ABSTRACT

Logical design of a circuit or a printed board including a number of components is carried out with improved flexibility in determination of the positions and the number of logical terminals of a symbol in order to easily create a logical circuit diagram high invisibility due to absence of deficiency such as interconnections crossing. The design aid apparatus includes a terminal information retaining section for retaining terminal information pieces; a tentative symbol determining section for determining a tentative symbol, for each component, having tentative logical terminals; a tentative symbol arranging section for arranging the determined tentative symbol; and a symbol determining section for determining the tentative symbol to be the symbol representing each component by, for the component, allocating each retained terminal information piece to one of the tentative logical terminals of the arranged tentative symbol.

20 Claims, 16 Drawing Sheets

AID APPARATUS, COMPUTER-READABLE RECORDING MEDIUM IN WHICH DESIGN AID PROGRAM IS STORED, AND INTERACTIVE DESIGN AID APPARATUS

BACKGROUND

1. Field

The present art relates to a design aid apparatus, a design aid program and a computer-readable recording medium in which the design aid program is stored that are for aiding logical design of a circuit or a printed board formed by a number of components.

2. Description of the Related Art

In conventional logical design for a circuit and a printed board (hereinafter simply called a circuit) with CAD (Computer Aided Design) system, each component of the circuit is substituted by a symbol in the form of a simple abstract shape (e.g., rectangle) which is different from the actual shape and has terminals equivalent to the actual component and then arrangement and wiring interconnection of the components are determined.

As shown by the example of FIG. 14, conventional CAD system 100 creates symbols representing components that constitute a circuit, registers the created symbols in a library ("LIBRARY" in the drawing) 101 beforehand, and reads symbols from library 101 for designing various circuits.

Specifically, an operator (designer) sets, with an input interface (exemplified by a mouse and/or a keyboard, not shown), component pin information representing attributes of a pin component (logical terminal, hereinafter also called logical pin) such as component pin name, pin exchange group number, input/output classification, output pin attribute, function, polarization, pin code, and open availability with reference to component pin data creating screen 102 displayed on a monitor (not shown) and registers the component pin information into library 101.

Further, the operator determines symbol information including the shape and the pin positions of each symbol as shown by symbol data creating screen 103 with the input interface and registers the created symbol information, in association with the above component pin information, into library 101.

As described above, in a conventional technique, information concerning a symbol to be registered in library 101 has included data that the symbol has which pin at which position, in addition to the shape and the size of the symbol, and the information has been commonly used for logical design of various circuits.

In the event of logical design, symbols have been read from library 101 and used for the logical design (see circuit diagram creating screen 104).

For example, symbols 106-108 that constituting logical circuit (hereinafter simply called circuit) 105 are read from library 101, as shown in FIG. 15. As described above, symbols 106-108 have logical pins whose position has been determined previously. In this example, symbol 106 includes logical pins whose logical pin names are A1-A7 from the top on the left side and logical pins with logical pin names B1-B7 from the top on the right. Symbol 107 includes logical pins with logical pin names J, K RES from the top on the left side and logical pins with logical pin names Q, Q' from the top on the right side. Similarly, symbol 108 includes logical pins with logical pin names C1 and C2 on from the top the left side and a logical pin with logical pin name C3 on the right side. In addition to those symbols, circuit 105 includes power source 109.

In logical design for some circuit, a wiring process to interconnect logical pins of a number of symbols 106-108 may cause a deficiency of interconnections crossing as shown by the portions enclosed by dotted lines X and Y in FIG. 16. The presence of interconnections crossing complicates the logical circuit diagram, impairing the visibility.

For this reason, since the same component may have various symbol definitions (e.g., the positions of logical pins and a symbol division number) varying with circuit to be designed, the operator preferably creates an optimum symbol each time the corresponding component is used in logical design.

In other words, logical design preferably considers and determines the positions of logical pins of a component symbols and whether or not the symbol is to be divided for each circuit to be design.

However, since registering recent symbols each having hundreds of pins into library 101 burdens the operator with an excessively great amount of load, the conventional technique has used symbols already registered in library 101 for logical circuit even if the symbols have not had proper logical expression (in other words, even if the symbols cause deficiency such as interconnections crossing).

As a solution, a symbol which is not suitable for a circuit to be designed may be corrected and be additionally registered into library 101 (see FIG. 14), but that makes it difficult to manage library 101 and expands the volume of library 101.

There have been proposed techniques of logical design in which a symbol is modified but the modified symbol is not registered into library, which techniques are exemplified by: in layered design of a logical circuit, performing merging and sorting processes based on pin names and pin attributions in order to simplify interconnections of a number of logical circuits on the same layer or different layers, and creating rectangular symbol each of which represents each logical circuit and has logical pins with the pin names arranged on the vertical sides (below Patent Reference 1); modifying a logical symbol extracted from a logical symbol library according to the number of signal line (below Patent Reference 2); and making the size and the reference point of a symbol and the position of pin of the symbol into variations (below Patent Reference 3).

Since these prior techniques disclosed in Patent References 1-3 however determine the number and the position of pins of a symbol which has not been arranged yet, the operator has to determine the number and the positions of the symbol in advance such that the entire logical terminal is not complicated to impair the visibility. These techniques call for experience and capability of an operator and may result in actual symbol arrangement having deficiency such as intersection crossing.

In particular, logical design of a circuit including a symbol with from tens to hundreds of pins or a circuit including a large number of symbols may require repeated determination of the number and the position of pins of a symbol unit until a logical circuit with highly visibility is obtained. Consequently, it is very difficult for previous determination of the pin number and the pin positions to design a highly visible circuit.

[Patent Reference 1] Japanese Patent Application Laid-Open No. HEI 10-134092

[Patent Reference 2] Japanese Patent Application Laid-Open No. HEI 3-121568

[Patent Reference 3] Japanese Patent Application Laid-Open No. HEI 7-44589

SUMMARY

With the foregoing problems in view, the object of the present art is to easily create, through logical design, a logical circuit diagram high in visibility without deficiency such as interconnections crossing by improving flexibility in determination of the positions and the number of logical terminals in a symbol.

To attain the above object, as the first generic feature, there is provided a design aid apparatus for aiding logical design of a circuit a plurality of components of which are represented by symbols, comprising: a terminal information retaining section for retaining terminal information pieces, one for each terminal of each of the plurality of components; a tentative symbol determining section for determining a tentative symbol, for each of the components, having one or more tentative logical terminals; a tentative symbol arranging section for arranging the tentative symbol determined by the tentative symbol determining section; and a symbol determining section for determining the tentative symbol to be the symbol representing each of the components by, for each of the components, allocating each of the terminal information pieces retained by the terminal information retaining section to one of the tentative logical terminals of the tentative symbol arranged by the tentative symbol arranging section.

As a preferable feature, the design aid apparatus may further comprise a tentative logical terminal selecting section for selecting a tentative logical terminal from the one or more tentative logical terminals of the tentative symbols arranged by the tentative arranging section, and a terminal information selecting section for selecting a terminal information piece from a plurality of the terminal information pieces retained by the terminal information retaining section, and the symbol determining section may allocate, for each of the components, the terminal information piece selected by the terminal information selecting section to the tentative logical terminal selected by the tentative logical terminal selecting section.

As another preferable feature, the design aid apparatus may further comprise a tentative symbol information setting section for setting tentative symbol information concerning the tentative symbol representing each of the components and including at least the number of tentative logical terminals of the tentative symbol, and the tentative symbol determining section may generate the tentative symbol based on the tentative symbol information set by the tentative symbol information setting section.

As an additional preferable feature, the design aid apparatus may further comprise a tentative symbol retaining section for retaining one or more tentative symbols each corresponding to a component, and the tentative symbol determining section may extract a tentative symbol representing one of the plurality of components of the circuit from the tentative symbol retaining section.

As a further preferable feature, the design aid apparatus may further comprise a symbol retaining section for retaining one or more symbols representing one or more of the plurality of components, and the symbol determining section may determine the one or more symbols retained by the symbol retaining section to be the symbol representing the one or more components.

To accomplish the above object, as the second generic feature, there is provided a program for aiding logical design of a circuit a plurality of components of which are represented by symbols, wherein the program instructs a computer having a terminal information retaining section for retaining terminal information pieces, one for each terminal of each of the plurality of components to function as: a tentative symbol determining section for determining a tentative symbol, for each of the components, having one or more tentative logical terminals; a tentative symbol arranging section for arranging the tentative symbol determined by the tentative symbol determining section; and a symbol determining section for determining the tentative symbol to be the symbol representing each of the components by, for each of the components, allocating each of the terminal information pieces retained by the terminal information retaining section to one of the tentative logical terminals of the tentative symbol arranged by the tentative symbol arranging section.

Further, as the third generic feature, there is provided a computer-readable recording medium in which the above program for aiding logical design is stored.

As described above, in the present art, the tentative symbol arranging section arranges a tentative symbol determined by the tentative symbol determining section; the symbol determining section determines the tentative symbol to be the symbol by allocating each of terminal information pieces retained in the terminal information retaining section to one of tentative logical terminals of the tentative symbol arranged by the tentative symbol arranging section. With this configuration, since a symbol can be dynamically created by determining logical terminals of the tentative symbols after the tentative symbol whose logical terminals are not defined have been arranged, flexibility in determining the positions and the number of logical terminals of a symbol is improved in the event of logical design of a circuit or a printed board including a number of components. As a consequence, the operator can easily create a logical circuit diagram high in visibility due to absence of deficiency such as interconnections crossing.

Other objects and further features of the present art will be apparent from the following detailed description when read in conjunction with the accompanying drawings.

DESCRIPTION OF THE PREFERRED EMBODIMENTS

A preferred embodiment of the present art will now be described with reference to the accompanying drawings.

[1] Description of an Embodiment of the Present Art

Figure 1:
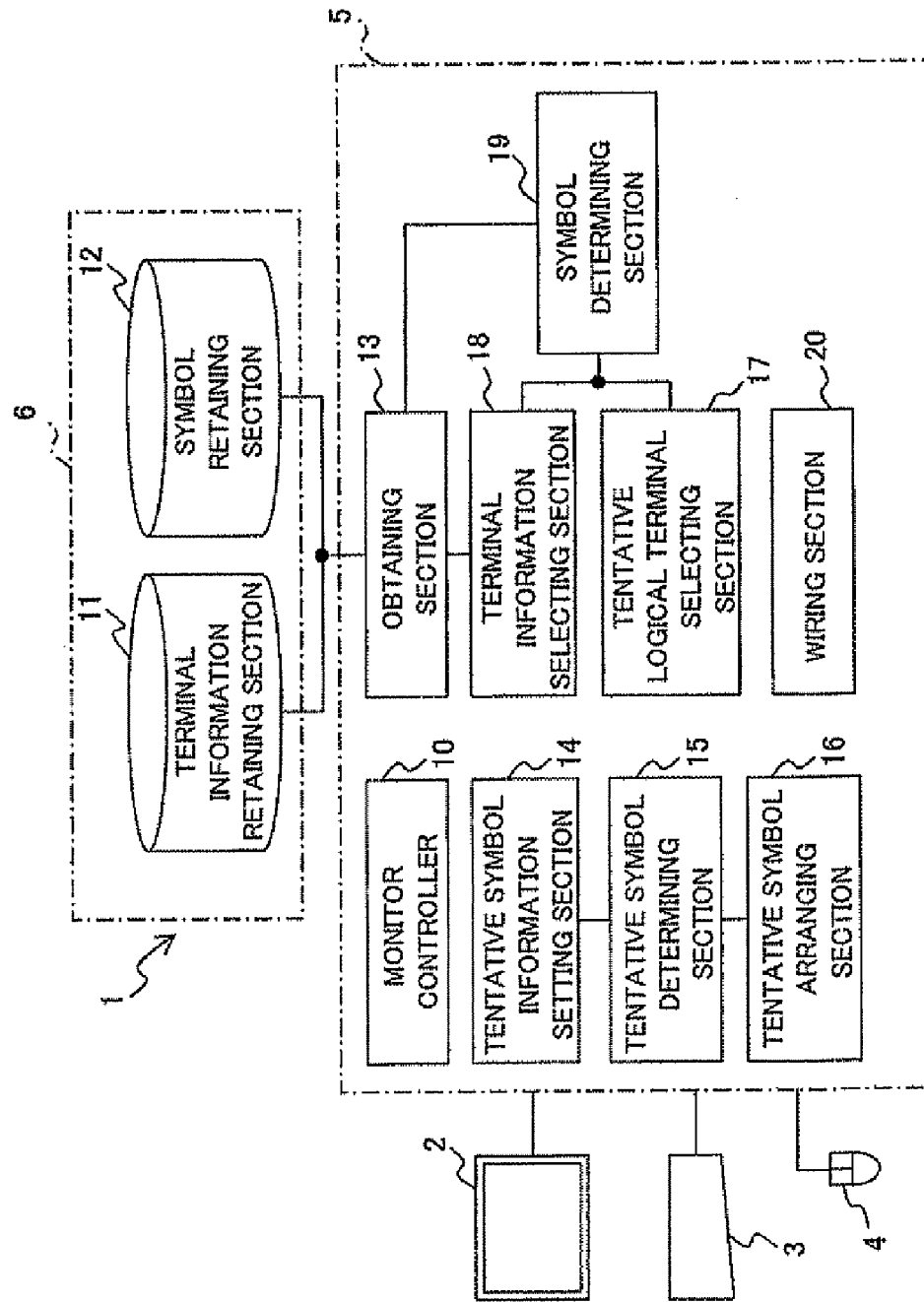
FIG. 1 is a block diagram schematically showing the configuration of a design aid apparatus according to an embodiment of the present art.

To begin with, description will now be made in relation to an interactive design aid apparatus (hereinafter simply called design aid apparatus) 1 according to an embodiment of the present art. As shown in FIG. 1, design aid apparatus 1 aids logical design of a circuit and a printed board (hereinafter simply called a circuit) in which components of the circuit are represented by simple abstract shapes (e.g., rectangles) which are different from the actual shapes and have terminals equivalent to the actual components. Specifically, design aid apparatus 1 includes monitor 2, keyboard 3 and mouse 4 serving as an input interface to input instructions of the operator (designer) to design aid apparatus 1, monitor controller 10, terminal information retaining section 11, symbol retaining section 12, obtaining section 13, tentative symbol information setting section 14, tentative symbol determining section 15, tentative symbol arranging section 16, tentative logical terminal selecting section 17, terminal information selecting section 18, symbol determining section 19, and wiring section 20.

Figure 2:
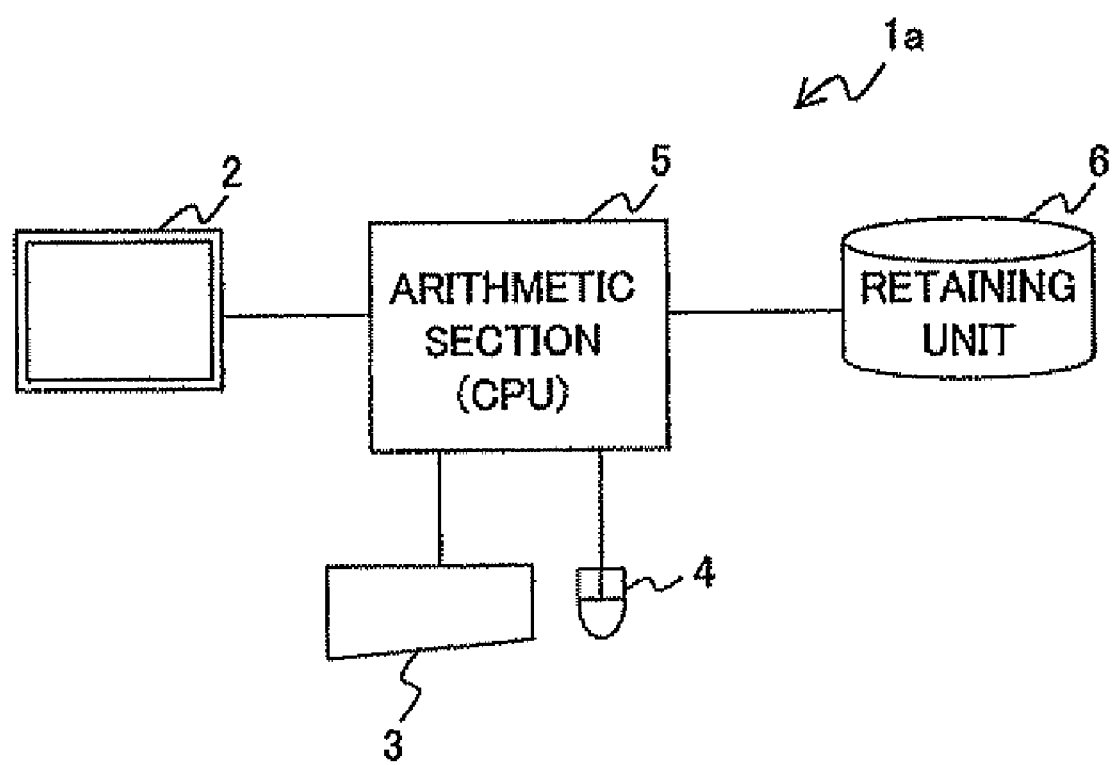
FIG. 2 is a diagram showing the configuration of a computer serving as the design aid apparatus of the embodiment of the present art.

Here, design aid apparatus 1 takes the form of computer 1a equipped with arithmetic section 5 (e.g., a CPU (Central Processing Unit)), to which monitor 2, keyboard 3, and mouse 4 are connected, and retaining unit 6 connected to arithmetic section 5, as shown in FIG. 2.

In other words, monitor controller 10, obtaining section 13, tentative symbol information setting section 14, tentative symbol determining section 15, tentative symbol arranging section 16, tentative logical terminal selecting section 17, terminal information selecting section 18, symbol determining section 19, and wiring section 20 are realized by arithmetic section 5 executing a certain application program (a design aid program that is to be described below).

Terminal information retaining section 11 and symbol retaining section 12 are realized by retaining unit 6 of computer 1a, but may be alternatively realized by a memory (not shown) incorporated in arithmetic section 5.

Monitor controller 10 controls contents displayed on monitor 2, and particularly controls and modifies the contents in accordance with the processes performed by obtaining section 13, tentative symbol information setting section 14, tentative symbol determining section 15, tentative symbol arranging section 16, tentative logical terminal selecting section 17, terminal information selecting section 18, symbol determining section 19, and wiring section 20.

Figure 3:
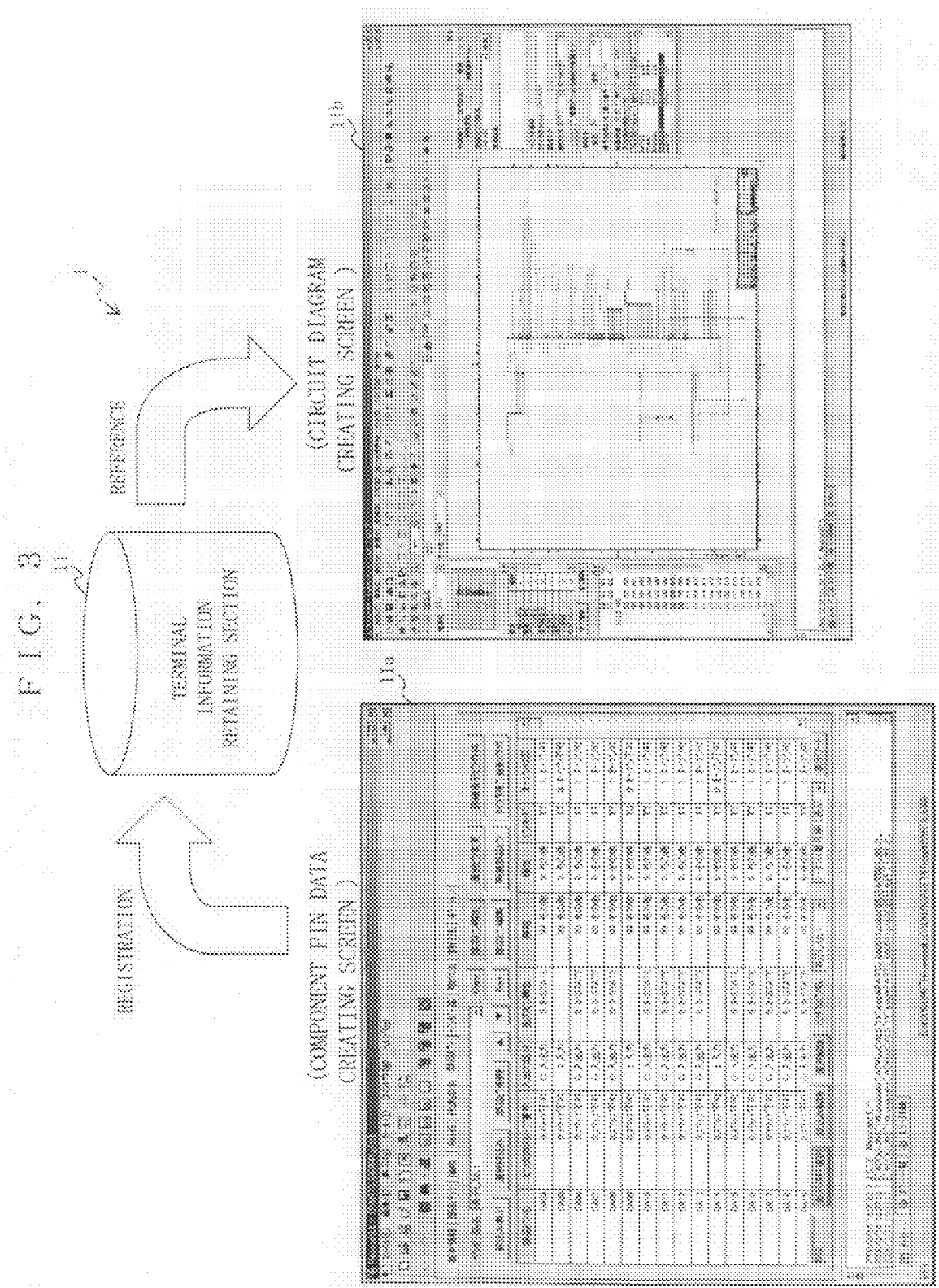
FIG. 3 is diagram illustrating a component pin data creating screen and a circuit diagram creating screen displayed on a monitor of the design aid apparatus of the embodiment of the present art.

Terminal information retaining section 11 retains terminal information formed by a number of terminal information pieces each of which concerns one of the terminals of the components that constitute a circuit. Each terminal information piece, as shown in FIG. 3, retains information representing attributes of a terminal (hereinafter also called pin) such as component pin name (here, "0A04" to "0A19"), pin exchange group number (here, "0: swap prohibited"), input/output classification (here, "C: input/output; I: output), output pin attribute (here, "5: 3-STATE), function (here, "99: other"), polarization (here, "9: other"), pin code (here, "TT", "TJ"), and open availability (here, "1: open enable; and 0: open prohibited). The contents of the terminal information of the present art should by no means be limited to the above examples and can there be modified considering a circuit to be designed and components of the circuit. Any information is satisfactory if specifies a terminal.

Component pin data creating screen 11a shown in FIG. 3 is a setting screen which is displayed on monitor 2 and with which terminal information is set. With reference to component pin data creating screen 11a, the operator inputs terminal information with keyboard 3 and mouse 4 (hereinafter called input interface), so that the terminal information is registered in terminal information retaining section 11 in advance.

If a circuit of the design object includes new components whose terminal information has not been registered in terminal information retaining section 11, the operator registers the terminal information of the new components in is terminal information retaining section 11 with the input interface.

Symbol retaining section 12 retains symbols of one or more of the components that form the object circuit.

Here, a "symbol" is a simple abstract shape which represents a component however in a different shape from the actual shape and which has one or more terminal equivalent to that of the component. Such a symbol is set to indicate which logical terminal (hereinafter, also called logical pin) is arranged at which point.

Symbol retaining section 12 retains symbols of components which is relatively small in terminal number and simple in configuration and which consequently has terminals whose number and positions are less modified when being applied to logical design of various circuits. A symbol representing a component which has a large number of logical terminals whose positions vary with object circuit is not registered in symbol retaining section 12.

In other words, in design aid apparatus 1, the symbol and the terminal information piece of a component having logical terminals whose positions do not vary with object circuit are previously registered in symbol retaining section 12 and terminal information retaining section 11, respectively, in association with each other and used in logical design of a circuit similarly to the conventional technique described with reference to FIG. 14. In the meanwhile, the symbol of a component having a large number of logical terminals whose quantity and positions preferably vary with object circuit is not registered in symbol retaining section 12, but logical design is made using a tentative symbol of the same component which symbol has logical terminal whose quantity and positions have not been fixedly determined, so that the number and the position of logical terminals can be occasionally modified in accordance with the object circuit during logical design (see circuit diagram creating screen 11b in FIG. 3). A tentative symbol is more detailed in the below explanation to be made for tentative symbol information setting section 14 and tentative symbol determining section 15.

Obtaining section 13 obtains a piece of terminal information concerning a component from terminal information retaining section 11 with reference to component specification information of the component name and/or the model number to specify the component which component specification information has been input by the operator via the input interface.

Here, the component name of component specification information is the name of a component used in logical circuit design. If a number of identical components are arranged in a single circuit, different names are allocated to the identical components. Further, the model number of component specification information is identical to actual model number (for example, to specify the component in a catalogue).

In addition, obtaining section 13 obtains a symbol representing the component in question from symbol retaining section 12 on the basis of the component specification information if the symbol has been registered in symbol retaining section 12.

Tentative symbol information setting section 14 sets, for each tentative symbol, tentative symbol information including the number of tentative logical terminals (anchors, hereinafter also called tentative pins), the positions and the intervals of the tentative logical terminals, and a portion name to indicate one of the divided tentative symbols if a component is divided into two or more tentative symbols.

The position of a tentative logical terminal is information to specify a region in which the tentative logical terminal is to be arranged. Since design aid apparatus 1 of the first embodiment uses rectangular tentative symbols, the position of a tentative logical terminal can be one of the six kinds of vertical sides, horizontal sides, right side, left side, upper side and lower side. If the vertical sides are set to be the position, a designated number of tentative pins are formed on each of the right and the left sides; and setting the horizontal sides forms a designated number of tentative pins on each of the upper and the lower sides.

Tentative symbol determining section 15 determines a tentative symbol of a component of a circuit, and more particularly determine the shape and the size of the tentative symbol and the positions and the number of tentative pins of the tentative symbol on the basis of tentative symbol information set by tentative symbol information setting section 14. Tentative symbol determining section 15 may further displays the component name or the component model number on the tentative symbol on the basis of component specification information including the component name or the component model number on the tentative symbol for specifying the component which information has been input by the operator via the input interface.

Figure 4:
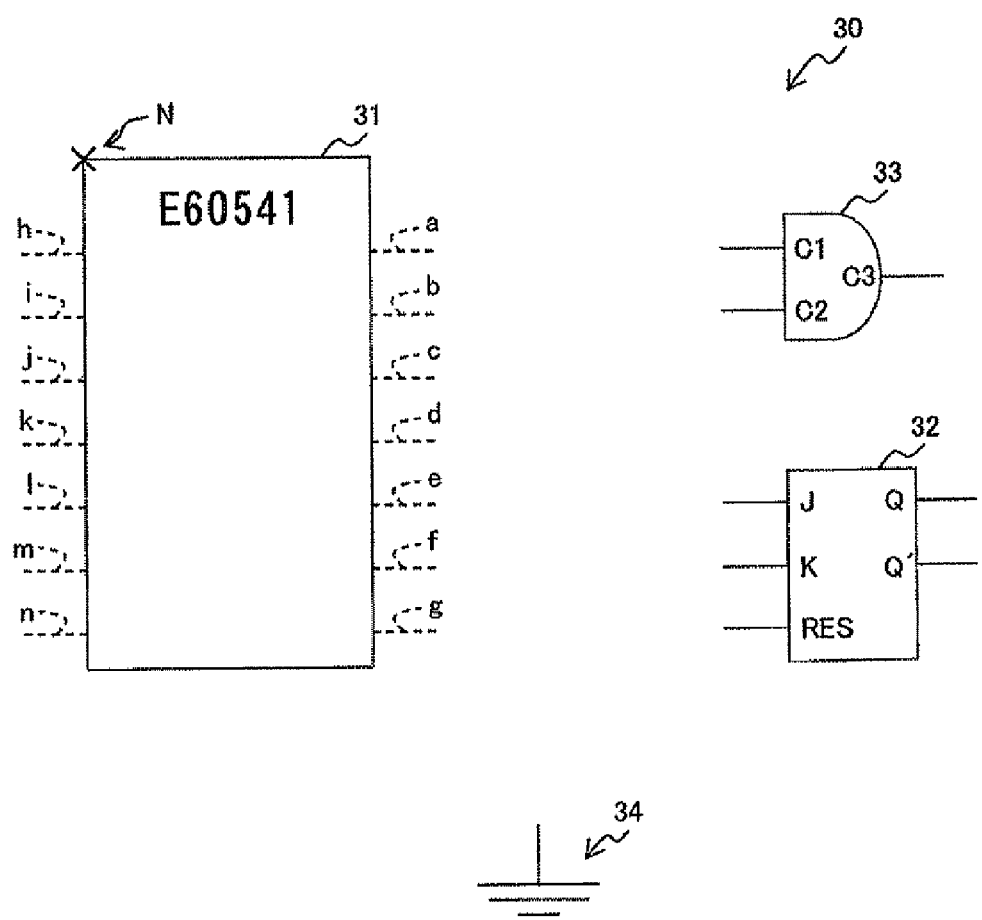
FIGS. 4-7 are diagrams showing examples of a logical circuit diagram in various stages of a design process by the design aid apparatus of the embodiment of the present art.

More specifically, tentative symbol determining section 15 previously stores a model of a predetermined shape (in the illustrated example, a rectangular) in a memory (not shown) or the like, and creates a tentative symbol 31 exemplified by that shown in FIG. 4 on the basis of the number, the positions, and the intervals of tentative pins in the tentative symbol information.

Tentative symbol 31 (shown in FIG. 4) is determined on the basis of tentative symbol information including at least the tentative pin number of "7" and the positions of the tentative pins of "vertical sides" by tentative symbol determining section 15. The tentative symbol 31 includes tentative pins a-n represented by broken lines and attached the model number "E60541". Hereinafter, the component whose model number is "E60541" and which corresponds to tentative symbol 31 is called an actual component.

Tentative symbol 31 determined by tentative symbol determining section 15 in the above manner has determined the number and the positions of tentative pins a-n, but have not determined the actual forms of the tentative pins a-n because the tentative pins a-n has not associated with terminal information pieces one for each terminal of the component in question. Further, the number and the position of tentative pins determined by tentative symbol 31 determining section 15 can be properly modified and that will be detailed in the below description made for symbol determining section 19.

Tentative symbol 31 arranging section 16 arranges tentative symbols determined by tentative symbol determining section 15 in accordance with instructions input by the operator via the input interface. In the example shown in FIG. 4, the operator moves the pointer to the X mark N on circuit (logical circuit) 30 displayed on monitor and clicks the mark with mouse 4 to arrange tentative symbol 31 on circuit 30, regarding the X mark N as the base point.

Circuit 30 includes symbols 32 and 33 and power source 34 in addition to tentative symbol 31.

Tentative logical terminal selecting section 17 selects one from the tentative pins a-n of tentative symbol 31 arranged by tentative symbol arranging section 16 on the basis of the instructions of the operator input via the input interface. The selection for a tentative pin is made by the operator moving the pointer and clicking an object tentative pin among the tentative terminals a-n.

Terminal information selecting section 18 selects a terminal information piece which concerns a terminal of an actual component associated with tentative symbol 31 and which is retained in terminal information retaining section 11. In the illustrated example, terminal information selecting section 18 selects an object terminal information piece from a number of terminal information pieces which obtaining section 13 has obtained from terminal information retaining section 11.

Figure 5:
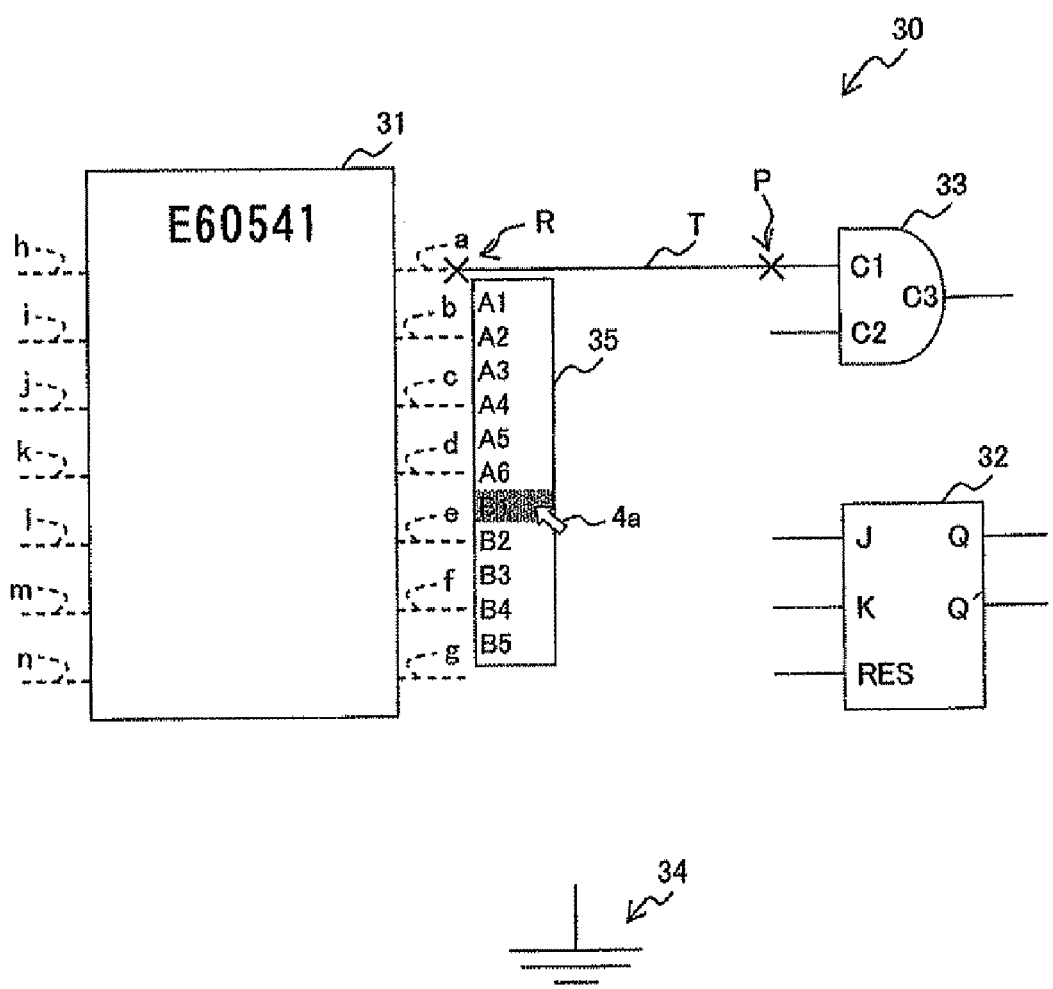

Specifically, a click of tentative pin a with mouse 4 by the operator (i.e., selection for tentative pin a by tentative logical terminal selecting section 17) prompts terminal information selecting section 18 to cooperate with monitor controller 10 in displaying component pin names (here, A1-A6, B1-B5) included in terminal information pieces of the actual component which information is obtained by obtaining section 13 from terminal information retaining section 11 in field 35 on monitor 2 as shown in FIG. 5.

Field 35 is preferably displayed near the tentative pin a that has been selected, and display controller 10 shades one of the selectable component pin name by terminal information selecting section 18 according to the position of pointer 4a (see component pin name B1 in FIG. 5).

An operator's click of component pin name B1 being shaded causes terminal information selecting section 18 to select the terminal information piece with component pine name "B1".

Symbol determining section 19 allocates terminal information pieces each of which concerns one of the terminals of the actual component and which is retained in terminal information retaining section 11 to one of tentative logical terminals a-n of tentative symbol 31 arranged by tentative symbol arranging section 16 so that tentative symbol 31 is determined to be a symbol. Specifically, symbol determining section 19 allocates the object terminal information piece selected by terminal information selecting section 18 to the object tentative pin selected by tentative logical terminal selecting section 17.

Figure 6:
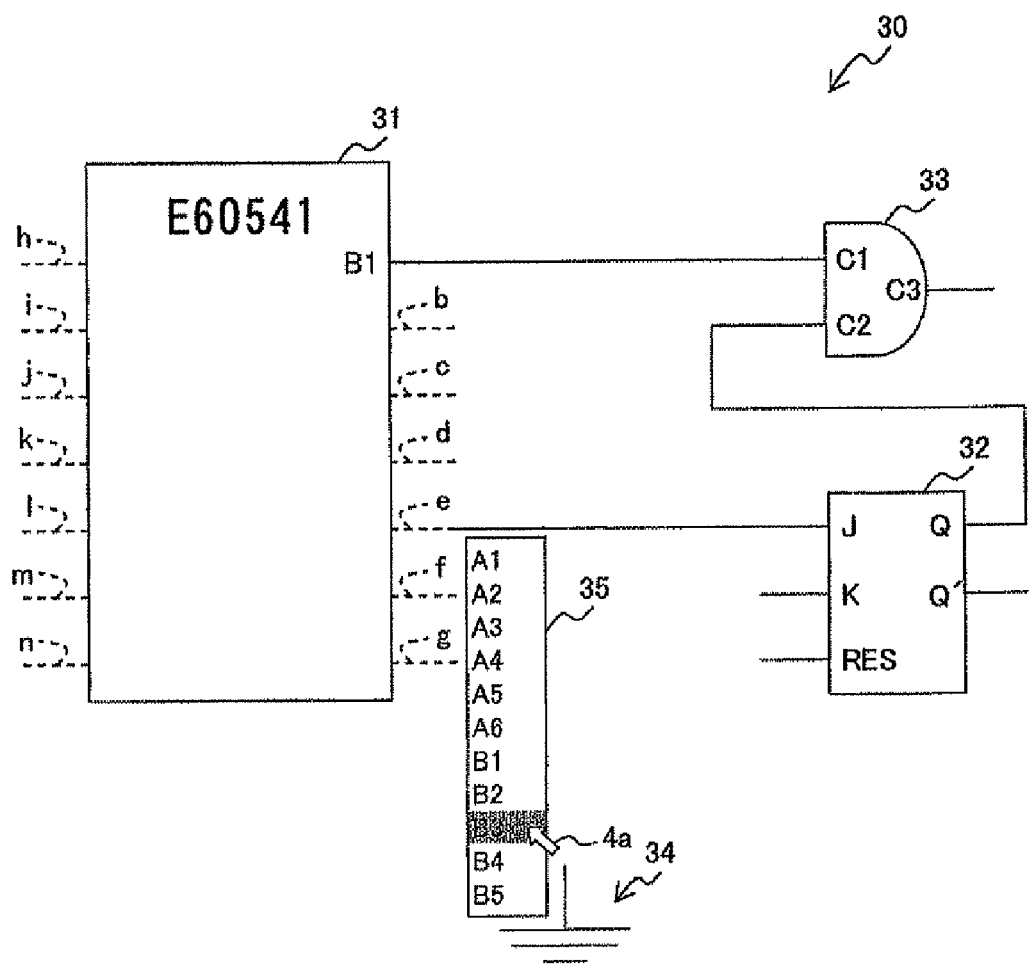

In the example shown in FIG. 5, symbol determining section 19 allocates the terminal information piece having the component pin name of "B1" to tentative pin a, so that the tentative pin a is determined to be logical terminal B1 as show in FIG. 6.

The selections by terminal information selecting section 18 and tentative logical terminal selecting section 17 and the allocation by symbol determining section 19 are repeatedly performed to allocate each of objective terminal information pieces concerning logical terminals used for an actual component of circuit 30 to be designed among the terminal information pieces read by obtaining section 13 from terminal information retaining section 11 to one of tentative pins a-n.

As the consequence, the tentative symbol 31 has undergone the above processes is determined to be symbol 36 that is to be detailed below (with reference to FIG. 8) by symbol determining section 19.

As shown in FIG. 6, symbol determining section 19 may allocate terminal information pieces (in this example, with component pin names "A1-A6, and B1-B5") to tentative pins a-n in any order considering to the relative positions with other symbols 32 and 33 (particularly, a symbol to be connected). The order is not limited to the descending order from the top position of tentative symbol 31.

Figure 16:
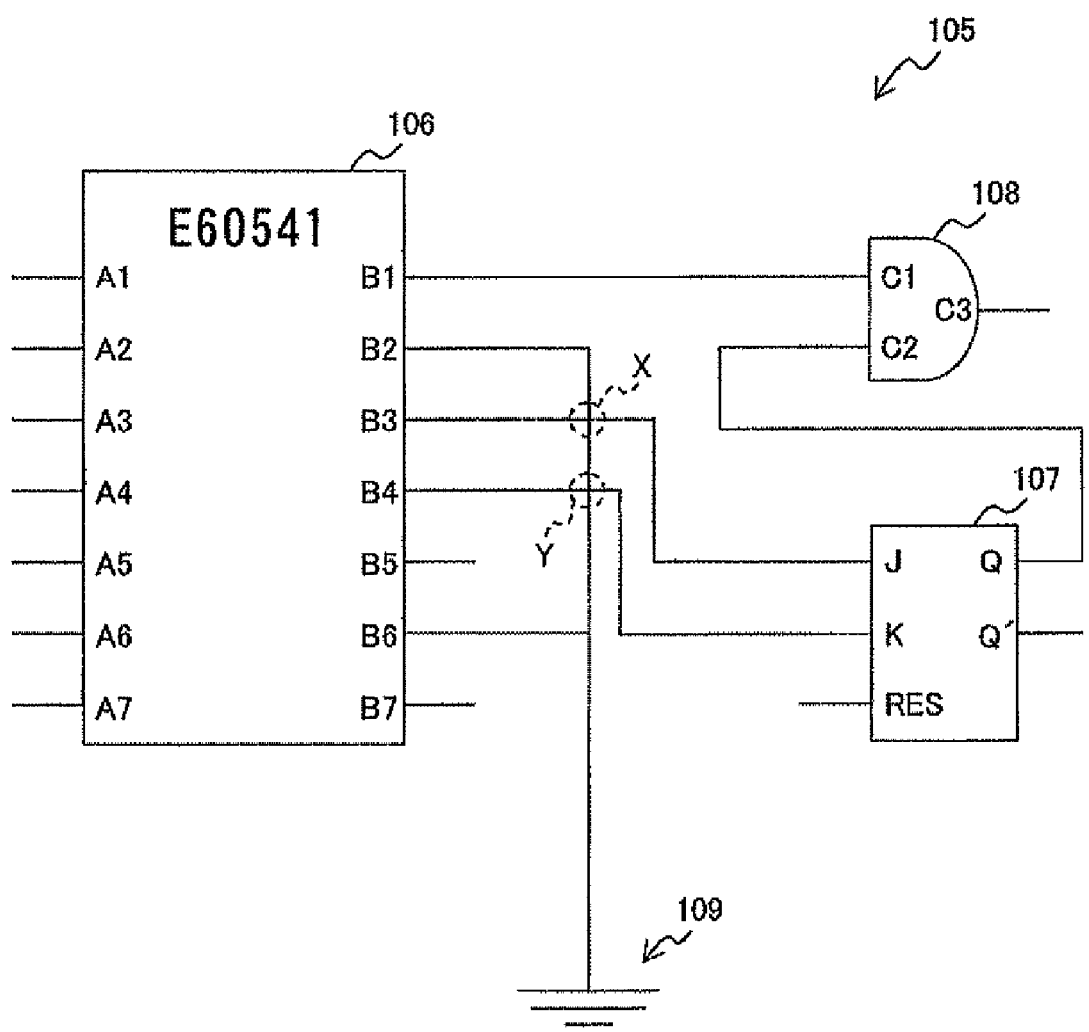
FIG. 16 is a diagram showing an example of a logical is circuit diagram designed by a conventional CAD system.

Since the procedural steps of allocation of a terminal information piece to a tentative pin by tentative logical terminal selecting section 17, terminal information selecting section 18, and symbol determining section 19 can freely determine as to which terminal information piece is allocated to which tentative pin, the operator can carry out a wiring process, avoiding crossing and complicated wiring which impair the visibility. Consequently, it is possible to make a logical circuit diagram high in visibility (see FIG. 8) because of absence of wiring intersections as compared with that made by a conventional technique which has wiring intersections (see FIG. 16).

Symbol determining section 19 can modify the number and the positions of tentative pins of tentative symbol 31 which have been determined by tentative symbol determining section 15 as required. For example, if logical design requires more tentative pins, symbol determining section 19 increases the number of tentative pins; if the tentative pins exceed the requisite quantity, symbol determining section 19 deletes excessive tentative pins; and symbol determining section 19 moves the position of a tentative pin as a solution to discrepancy such as wiring intersections.

Figure 7:
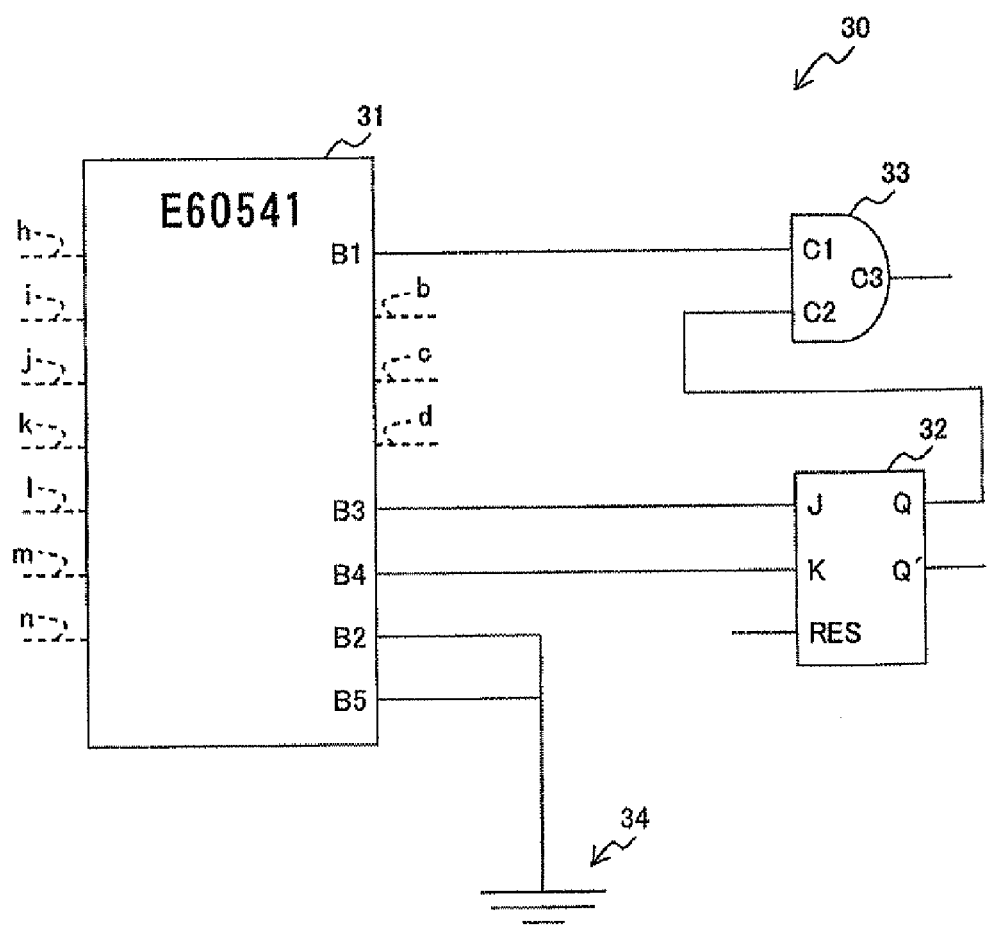
Figure 8:
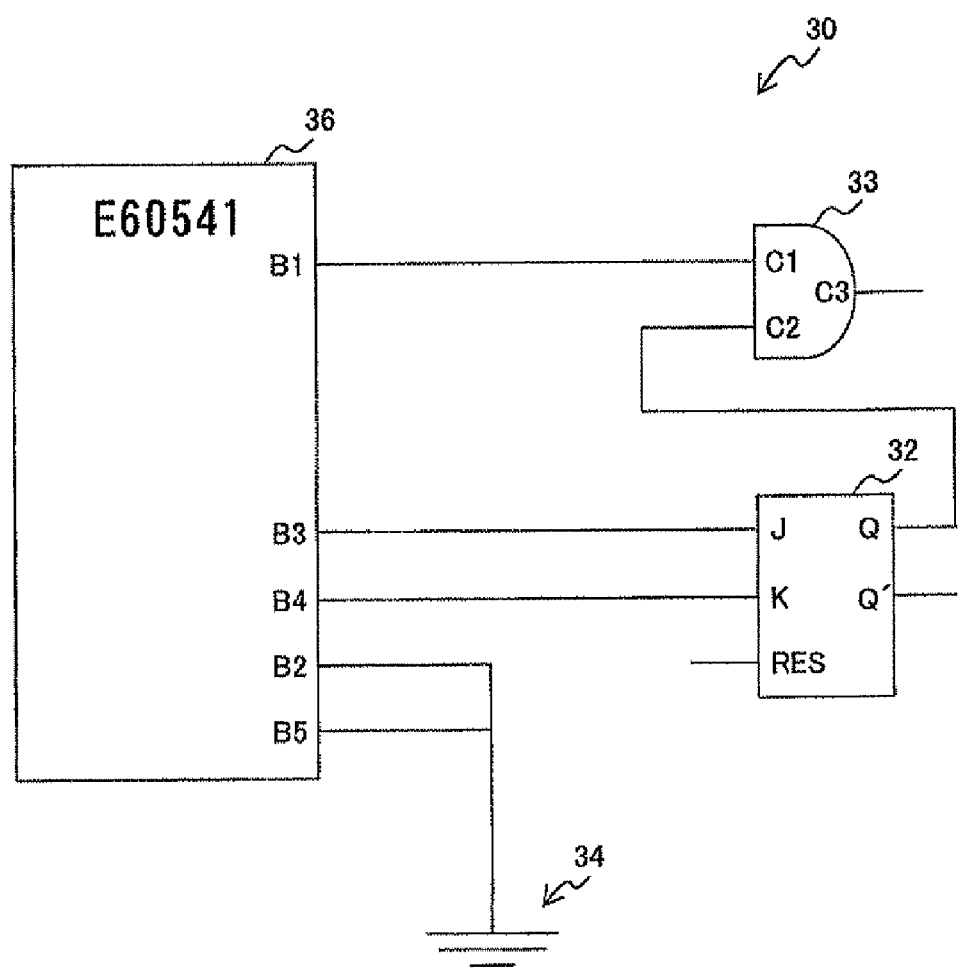
FIG. 8 is a diagram showing an example of a logical circuit diagram designed by the design aid apparatus of the embodiment of the present art.

Specifically, when symbol determining section 19 is to determine tentative symbol 31 in a state of having (tentative) logical pins B1-B5 shown in FIG. 7 to be symbol 36 shown in FIG. 8, symbol determining section 19 deletes tentative pins b-d and h-n.

Further, for logical pin B5, the terminal information having the component pin name "B5" is allocated to another tentative pin (not shown) that symbol determining section 19 has additionally increased. As addition of another tentative pin, symbol determining section 19 varies the shape of tentative symbol 31 accordingly to the addition.

Wiring section 20 interconnects logical pins with each other, a logical pin with a tentative pin, and tentative pins with each other in accordance with instruction input by the operator via the input interface. As shown in FIG. 5, selecting (clicking, see X marks P and R in FIG. 5) two terminals, in this example tentative pin a of tentative symbol 31 and logical pin C1 of symbol 33 with mouse 4 by the operator prompts wiring section 20 to interconnect these pins and C1 by interconnection wire T.

Wiring section 20 may interconnect pins before or after symbol determining section 19 allocates a terminal information piece to tentative pins.

Figure 9:
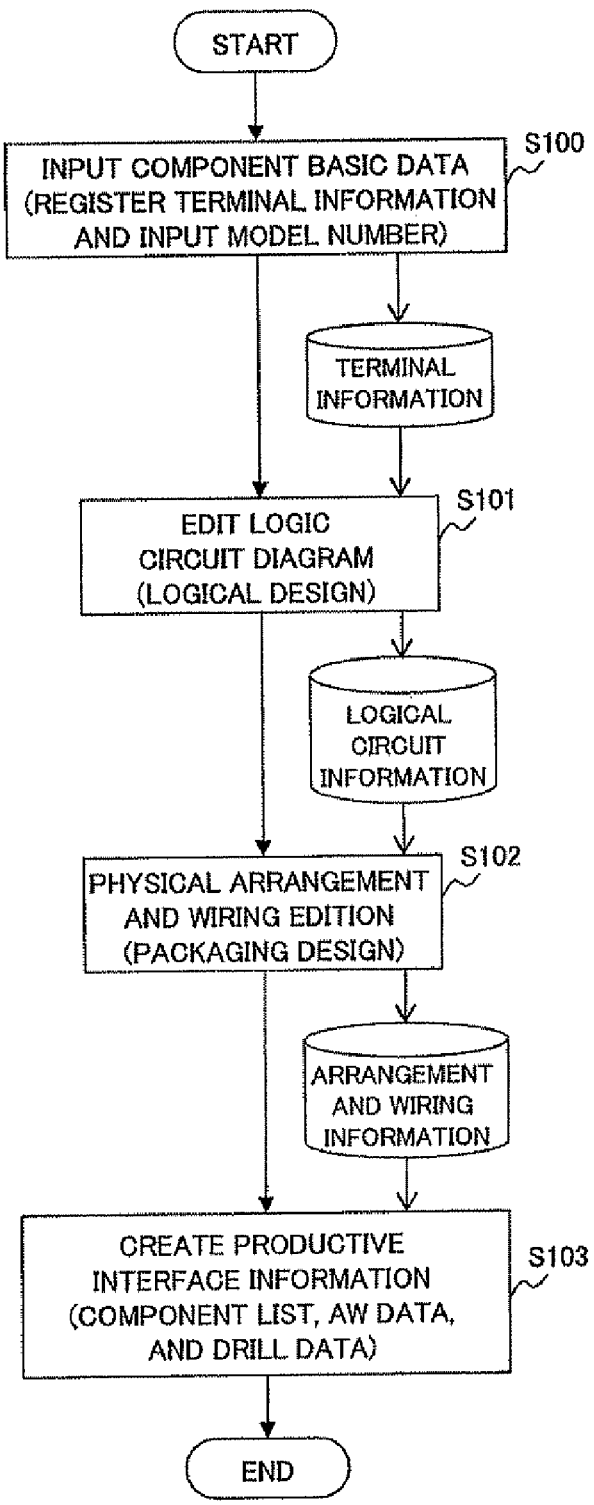
FIG. 9 is a flow diagram showing a succession of procedural steps of circuit design including the logical design made by the design aid apparatus of the embodiment of the present art.

Here, description will now be made in relation to the entire procedure to design a circuit (here, printed board) including logical circuit design by design aid apparatus 1 of the present art with reference to flow diagram FIG. 9 (steps S100 to S103).

First of all, the operator inputs component basic data with the input interface (step S100). In other words, in design aid apparatus 1, the operator registers terminal information pieces into terminal information retaining section 11 and inputs the model numbers (component specification information) of components to be included in the object circuit.

Next, design aid apparatus 1 edits a logic circuit diagram (i.e., logical design) using the terminal information pieces (step S101) and creates logical circuit information.

Using the logical circuit information, the operator determines physical arrangement and edits wiring (i.e., packaging design) (step S102) to create arrangement and wiring information.

At the final stage, the operator creates productive interface information of a printed board of the design object with reference to the arrangement and wiring information (step S103) More specifically, the operator creates a component list, AW (Art Work) data serving as Gerber data, and drill data to complete the series of the procedure.

Figure 10:
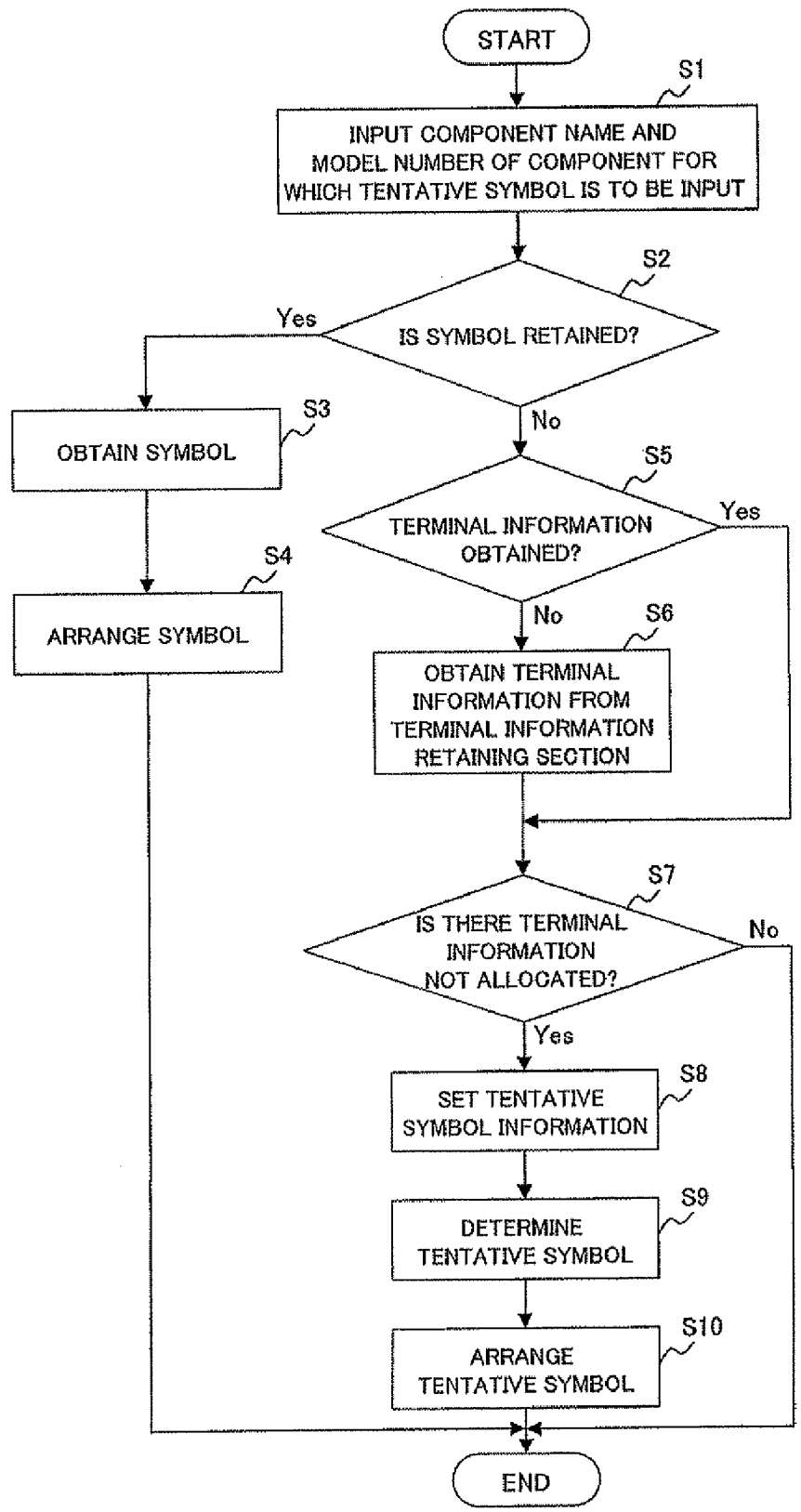
FIG. 10 is a flow diagram showing a succession of procedural steps of arranging tentative symbols by the design aid apparatus of the embodiment of the present art.

Next, description will now be made in relation to a succession of procedural steps performed to arrange a tentative symbol by design aid apparatus 1 with reference to flow diagram FIG. 10 (steps S1 to S10). Upon operator's inputting component specification information, including the component name and the model number of a component whose tentative symbol is to be inputted, via the input interface (step S1), obtaining section 13 retrieves a symbol of the component in question in symbol retaining section 12 (step S2).

If the symbol is retained in symbol retaining section 12 (Yes route in step S2), obtaining section 13 obtains the symbol, which symbol determining section 19 determines to be the symbol of the component in question (step S3) and which is then arranged in accordance with instructions input by the operator via an input interface (step S4) to complete the process. The step of the arranging may be performed by tentative symbol arranging section 16.

Conversely, if the symbol is not retained in symbol retaining section 12 (No route in step S2) and obtaining section 13 has not obtained the terminal information pieces of the component yet (No route in step S5), obtaining section 13 obtains the terminal information pieces of the component from terminal information retaining section 11 (step S6). If obtaining section 13 has already obtained the terminal information pieces of the component (Yes route in step S5), step S6 to be carried out by obtaining section 13 is skipped.

In succession, symbol determining section 19 judges whether or not there is a terminal information piece which is not allocated to any tentative pin among the terminal information pieces obtained (step S7) The judgment made by symbol determining section 19 is performed because, if the tentative symbol corresponding to the component whose component name and model number have been input by the operator in step S1 takes the form of a number of divided tentative symbols, one or more of the terminal information pieces may not be allocated and the tentative symbol should be surly divided into a number of tentative symbols.

If there is no terminal information piece that has not been allocated (No route in step S7), the procedure is completed. If there is a terminal information piece that has not been allocated (Yes route in step S7), tentative symbol information setting section 14 sets tentative symbol information (having the number and the positions of tentative pins, portion names and others) in accordance with instructions of the operator (step S8).

In succession, tentative symbol determining section 15 determines a tentative symbol based on the tentative symbol information set by tentative symbol information setting section 14 (step S9).

Tentative symbol arranging section 16 arranges the tentative symbol on the circuit (step S10) in accordance with the instructions of the operator to complete the arrangement process.

Figure 11:
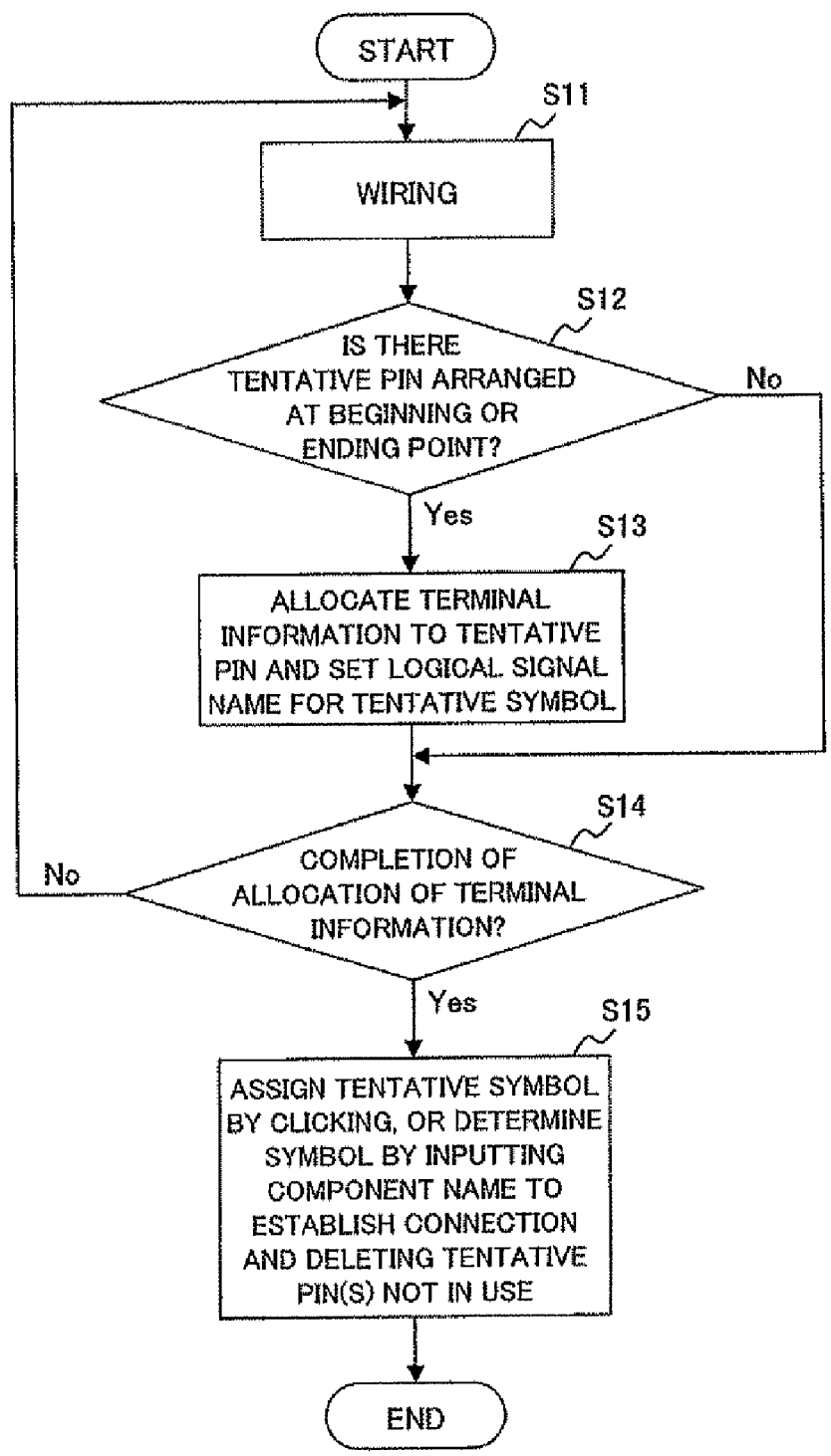
FIG. 11 is a flow diagram showing a succession of procedural steps of from wiring to symbol determination by the design aid apparatus of the embodiment of the present art.

Next, description will now be made in relation to a succession of procedural steps performed between arrangement of a tentative symbol and determination of a symbol interposed by a wiring process with reference to flow diagram FIG. 11 (steps S11-S15). The procedure of FIG. 11 assumes that a terminal information piece is allocated to a tentative pin after the interconnection (wiring) of terminals.

To begin with, wiring section 20 carries out a wiring process to interconnect terminals in accordance with instructions of the operator (step S11). Specifically, operator clicks two terminals prompt wiring section 20 to interconnect the two terminals.

In succession, a judgment is made as to whether or not at least one of the two terminals (at the beginning or the end point) is a tentative terminal (i.e., whether or not tentative logical terminal selecting section 17 has selected a tentative pin) (step S11). If the result of the judgment is negative (No route in step S12), the procedure skips the subsequent step S13. Conversely, if the result of the judgment is positive (Yes route in step S12), symbol determining section 19 allocates a terminal information piece selected by terminal information selecting section 18 to the tentative pin and assigns a logical signal name (i.e., component pin name B1 shown in FIG. 6) to the tentative pin (step S13).

Then, the operator has not completed to allocate all the desired terminal information pieces to tentative pins of the component in question (No route in step S14), the procedure returns to the process of step S11. On the other hand, if the allocation of all the desired terminal information pieces has been completed (Yes route in step S14), symbol determining section 19 determines the tentative symbol to be the symbol representing the component in question (step S15).

Figure 12:
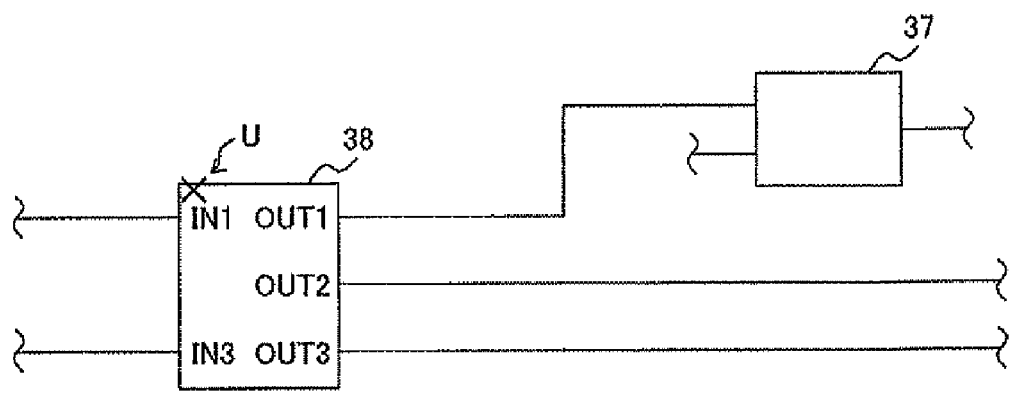
FIG. 12 is a diagram showing an example of a symbol determination process by a symbol determining section of the design aid apparatus of the embodiment of the present art.

Specifically, responsive to selection for symbol 37 and tentative symbol 38 interconnected with each other by operators clicking (here, the position at X-mark U) as shown in FIG. 12, symbol determining section 19 deletes tentative pins which are not interconnected to determine a symbol. Alternatively, if the operator inputs the component names with keyboard 3 to thereby establish the interconnection, the symbol determining section 19 deletes the tentative pins not in interconnection to determine the symbol and completes the procedural step.

In design aid apparatus 1 according to the embodiment, tentative symbol arranging section 16 arranges a tentative symbol determined by tentative symbol determining section 15, and symbol determining section 19 allocates one or more terminal information pieces which concern terminals of a component (corresponding to the tentative symbol and) which 1 are retained in terminal information retaining section 11 to one or more of the tentative logical terminals of the 3 tentative symbol arranged by tentative symbol arranging section 16, so that the tentative symbol is determined to be the symbol corresponding to the component. With this configuration, the logical terminals of a tentative symbol can be defined (in other words, the number and the positions can be determined) after the tentative symbol being undefined has been arranged. Such dynamically creation of symbols makes logical design of a circuit or a printed board formed by a number of components to enhance the flexibility in the positions and the number of logical terminals set for each symbols. The operator can consequently create a logical circuit diagram with no intersections of wirings and high in visibility with ease. In other words, the readability of a logical circuit diagram can be improved.

Since design aid apparatus 1 does not register symbols beforehand in a library or the like as performed by a conventional technique described with reference to FIG. 14 for future use, but determines symbols based on tentative symbols with the aid of symbol determining section 19, components can be flexibly divided into groups (i.e., function partitioning) according to a circuit of a design object, so that the operator can create a logical circuit diagram high in visibility with ease.

Further, since symbol determining section 19 allocates each terminal information piece selected by terminal information selecting section 18 to a tentative logical terminal selected by tentative logical terminal selecting section 17, each logical terminal can be freely and surely defined on the basis of the instructions input by the operator via the input interface.

Since, on the basis of tentative symbol information set by tentative symbol information setting section 14, tentative symbol determining section 15 creates a tentative symbol associated with one of the components of a circuit, the symbol in question do not have to be retained in a library or the like in advance. That reduces hardware resources required in design aid apparatus 1, and improves flexibility in design because the operator can freely determine a tentative symbol.

Simply setting of a portion name based on operator's instructions, tentative symbol information setting section 14 can divide a symbol representing a component into a number of portions to contribute to the improvement in design flexibility.

Flexibility in design can be further improved by symbol determining section 19, which deletes tentative logical terminals to which no logical information piece has been allocated and which increase tentative logical terminals. In particular, if a single component is to be represented by a number of tentative symbols in, divided forms, a logical design of a circuit can be performed, flexibly modifying allocation of each terminal information piece to which tentative symbol after arrangement of these tentative symbols on a logical circuit. As a consequence, the operator can create a logical circuit diagram high in visibility with further ease.

Since symbol determining section 19 deletes tentative logical terminals, a determined symbol does not include a tentative logical terminal.

Further, symbol determining section 19 can modify the position of a logical terminal to which a terminal information piece has been allocated and can reallocate another terminal information piece to the same logical terminal. That enhances the flexibility in design and makes the operator to create a logical circuit diagram high in visibility with further ease.

With the presence of symbol retaining section 12 which retains one or more symbols representing one or more of the components in advance, if a symbol of one of the components is stored, symbol determining section 19 determines the symbol stored in symbol retaining section 12 to represent the component in question. Logical design can be accomplished efficiently in a shorter time by registering symbols in which the number and the positions of logical terminals may not be modified in logical design of various circuits and which are consequently exemplified by simple components each having terminals of a relatively small number.

Figure 14:
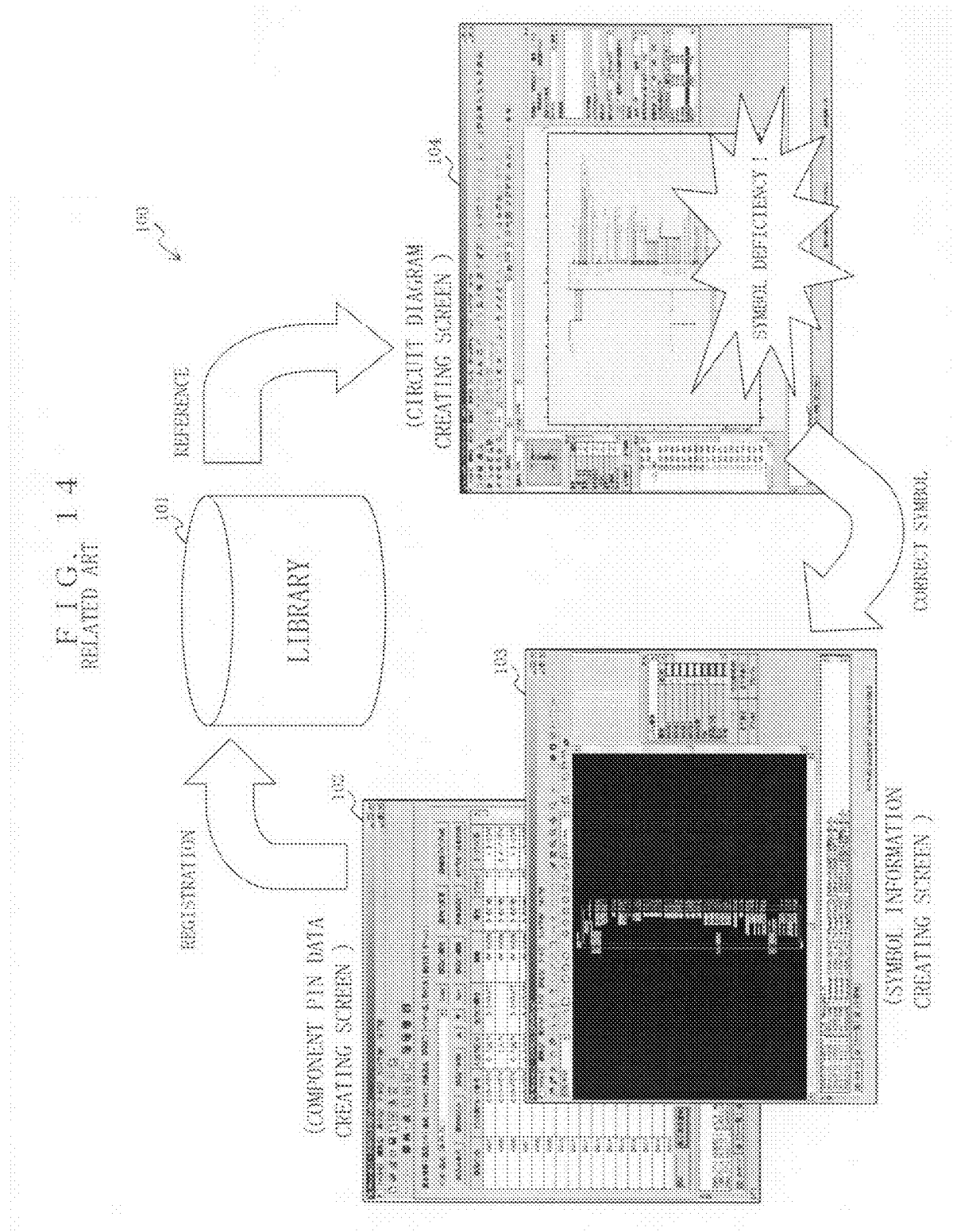
FIG. 14 is a diagram explaining a conventional CAD system.
Figure 15:
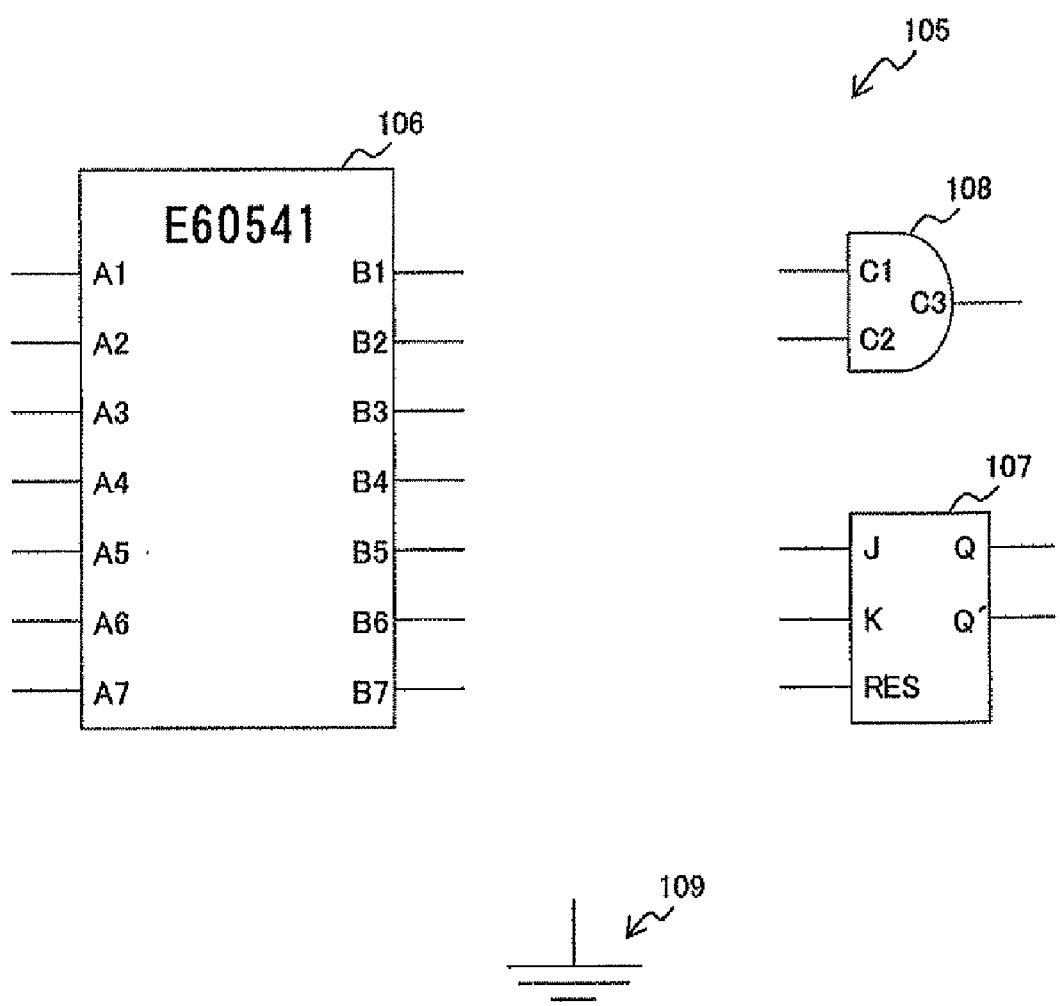
FIG. 15 is a diagram showing an example of a logical circuit diagram being designed by a conventional CAD system.

In addition, that can reduce the number of symbols registered in symbol retaining section 12 as compared with the conventional technique of FIG. 14 which registers symbols of all the components, so that symbol retaining section 12 can be maintained and managed with ease, contributing to reduction in hardware resources of design aid apparatus 1.

[2] Others

The present art should by no means be limited to the foregoing embodiment, and various changes or modifications may be suggested without departing from the gist of the art.

Figure 13:
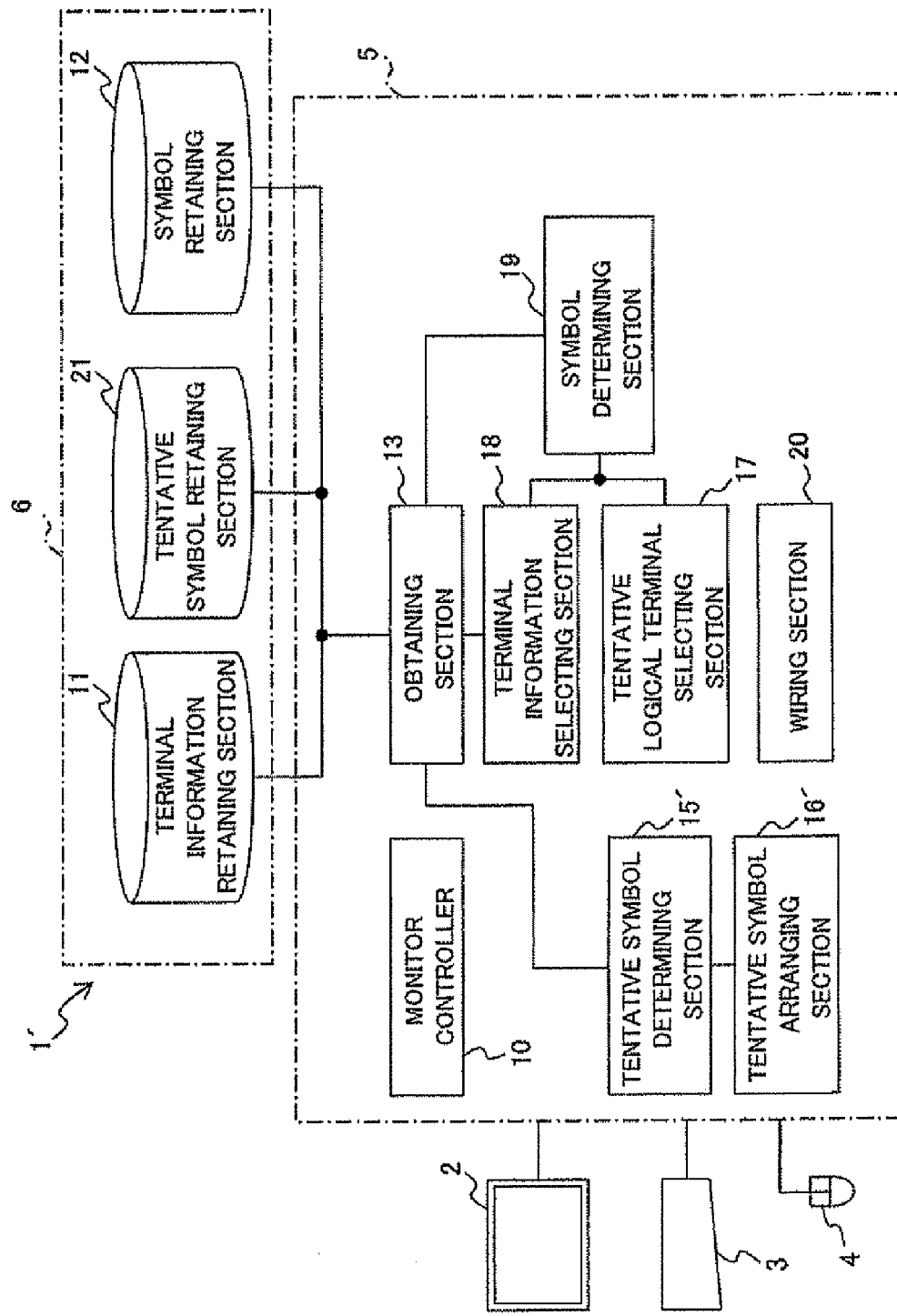
FIG. 13 is a block diagram schematically showing a design aid apparatus according to a modification to the embodiment.

For example, tentative symbol determining section 15 determines a tentative symbol on the basis of the tentative symbol information set by tentative symbol information setting section 14 in the first embodiment, but the present art should by no means be limited to this. Alternatively, design aid apparatus 1' according to a modification to the above first embodiment as shown in FIG. 13 may includes tentative symbol retaining section 21, which retains tentative symbols corresponding to components, and tentative symbol determining section 15', which extracts a tentative symbol corresponding to a component from tentative symbol retaining section 21.

Specifically, upon the operator inputs component specification information concerning a component via the input interface, obtaining section 13 retrieves a tentative symbol corresponding to the component in tentative symbol retaining section 21 considering the component specification information, and tentative symbol determining section 15' determines the tentative symbol obtained by obtaining section 13 through the retrieval to be the tentative symbol associated with the component in question.

That can eliminate the requirement for setting tentative symbol setting information each time the tentative symbol of the same component is used in design, improving design efficiency particularly of a component used for circuits of various types.

The present can be attained by the combination of design aid apparatus 1 and design aid apparatus 1' respectively according to the first embodiment and the modification thereto, and that can obtain the advantages of both design aid apparatuses 1 and 1'.

Description of the first embodiment and the modification is made assuming that design aid apparatuses 1 and 1' includes symbol retaining section 12, but the present art is not limited to. The present art may design all the components from tentative symbols without having symbol retaining section 12. That eliminates the requirement for a library of the conventional technique of FIG. 14 in which symbols are retained in advance and therefore reduces the hardware resources of design aid apparatuses 1 and 1'.

Above, functions as monitor controller 10, terminal information retaining section 11, symbol retaining section 12, obtaining section 13, tentative symbol information setting section 14, tentative symbol determining sections 15 and 15', tentative symbol arranging section 16, tentative logical terminal selecting section 17, terminal information selecting section 18, symbol determining section 19, and wiring section 20 may be realized by a computer (including a CPU, an information processor, various terminals) executing a predetermined application program (design aid program).

The program is provided in the form of being recorded in a computer-readable recording medium, such as a flexible disk, a CD (e.g., CD-ROM, CD-R, CD-RW), a DVD (e.g., DVD-ROM, DVD-RAM, DVD-R, DVD+R, DVD-RW, DVE+RW). Further, a computer may read the design aid program from such a recording medium and sends the read program to an internal or external memory to store for use. Further alternatively, the program may be recorded in a memory device (a recording medium), such as a magnetic disk, an optical disk or a magneto-optical disk, and is provided to computer from the memory device through a communication path.

Here, a computer is a concept of a combination of hardware and an OS (Operating System) and means hardware which operates under control of the OS. Otherwise, if an application program operates hardware independently of an OS, the hardware corresponds to the computer. Hardware includes at least a microprocessor such as a CPU and means to read a computer program recorded in a recording medium.

The application program serving as the design aid program includes program codes to instruct the computer described above to function as monitor controller 10, terminal information retaining section 11, symbol retaining section 12, obtaining section 13, tentative symbol information setting section 14, tentative symbol determining sections 15 and 15', tentative symbol arranging section 16, tentative logical terminal selecting section 17, terminal information selecting section 18, symbol determining section 19, and wiring section 20. This function may partially be realized by the OS, not by the application program.

The recording medium used in the first embodiment may be various computer-readable recording media such as an IC card, a ROM cartridge, a magnetic tape, a punch card, an internal storage unit (RAM or ROM) for a computer, an external storage unit, or a printing matter on which codes, such as bar codes, are printed, in addition to a flexible disk, a CD, a DVD, a magnetic disk, an optical disk and a magnet-optical disk above listed.

What is claimed is:

1. A design aid apparatus for aiding logical design of a circuit a plurality of components of which are represented by symbols, comprising:
    a terminal information retaining section for retaining terminal information pieces, one for each terminal of each of the plurality of components;
    a tentative symbol determining section for determining a tentative symbol, for each said component, having one or more tentative logical terminals;
    a tentative symbol arranging section for arranging the tentative symbol determined by said tentative symbol determining section; and
    a symbol determining section for determining the tentative symbol to be the symbol representing each said component by, for each said component, allocating each of the terminal information pieces retained by said terminal information retaining section to one of the tentative logical terminals of the tentative symbol arranged by said tentative symbol arranging section.

2. A design aid apparatus according to claim 1, further comprising
    a tentative logical terminal selecting section for selecting a tentative logical terminal from the one or more tentative logical terminals of the tentative symbols arranged by said tentative arranging section, and
    a terminal information selecting section for selecting a terminal information piece from a plurality of the terminal information pieces retained by said terminal information retaining section, wherein
    said symbol determining section allocates, for each said component, the terminal information piece selected by said terminal information selecting section to the tentative logical terminal selected by said tentative logical terminal selecting section.

3. A design aid apparatus according to claim 1, further comprising a tentative symbol information setting section for setting tentative symbol information concerning the tentative symbol representing each said component and including at least the number of tentative logical terminals of the tentative symbol, wherein
    said tentative symbol determining section generates the tentative symbol based on the tentative symbol information set by said tentative symbol information setting section.

4. A design aid apparatus according to claim 1, further comprising a tentative symbol retaining section for retaining one or more tentative symbols each corresponding to a component, wherein
said tentative symbol determining section extracts a tentative symbol representing one of the plurality of components of the circuit from said tentative symbol retaining section.

5. A design aid apparatus according to claim 1, wherein said symbol determining section deletes one or more tentative logical terminals to which the terminal information piece has not been allocated.

6. A design aid apparatus according to claim 1, wherein said symbol determining section increases the number of tentative logical terminals of the tentative symbol.

7. A design aid apparatus according to claim 1, further comprising a symbol retaining section for retaining one or more symbols representing one or more of the plurality of components, wherein
said symbol determining section determines the one or more symbols retained by said symbol retaining section to be the symbol representing the one or more components.

8. A non-transitory computer-readable recording medium in which a program for aiding logical design of a circuit a plurality of components of which are represented by symbols is recorded, wherein said program instructs a computer having a terminal information retaining section for retaining terminal information pieces, one for each terminal of each of the plurality of components to function as:
a tentative symbol determining section for determining a tentative symbol, for each said component, having one or more tentative logical terminals;
a tentative symbol arranging section for arranging the tentative symbol determined by said tentative symbol determining section; and
a symbol determining section for determining the tentative symbol to be the symbol representing each said component by, for each said component, allocating each of the terminal information pieces retained by said terminal information retaining section to one of the tentative logical terminals of the tentative symbol arranged by said tentative symbol arranging section.

9. A non-transitory computer-readable recording medium according to claim 8, wherein:
said program instructs the computer to function as a tentative logical terminal selecting section for selecting a tentative logical terminal from the one or more tentative logical terminals of the tentative symbols arranged by said tentative arranging section, and a terminal information selecting section for selecting a terminal information piece from a plurality of the terminal information pieces retained by said terminal information retaining section; and
said symbol determining section allocates, for each said component, the terminal information piece selected by said terminal information selecting section to the tentative logical terminal selected by said tentative logical terminal selecting section.

10. A non-transitory computer-readable recording medium according to claim 8, wherein:
said program instructs the computer to function as a tentative symbol information setting section for setting tentative symbol information concerning the tentative symbol representing each said component and including at least the number of tentative logical terminals of the tentative symbol; and
said tentative symbol determining section generates the tentative symbol based on the tentative symbol information set by said tentative symbol information setting section.

11. A non-transitory computer-readable recording medium according to claim 8, wherein said tentative symbol determining section extracts a tentative symbol representing one of the plurality of components of the circuit from a tentative symbol retaining section for retaining one or more tentative symbols each corresponding to a component.

12. A non-transitory computer-readable recording medium according to claim 8, wherein said symbol determining section deletes one or more tentative logical terminals to which the terminal information piece has not been allocated.

13. A non-transitory computer-readable recording medium according to claim 8, wherein said symbol determining section increases the number of tentative logical terminals of the tentative symbol.

14. A non-transitory computer-readable recording medium according to claim 8, wherein said symbol determining section determines, if one or more symbols representing one or more of the plurality of components is retained by a symbol retaining section for retaining a symbol representing a component of a circuit, the one or more symbols retained by said symbol retaining section to be the symbol representing the one or more components.

15. An interactive design aid apparatus for aiding logical design of a circuit a plurality of components of which are represented by symbols, comprising:
a monitor;
an input interface for inputting instructions of an operator into said apparatus;
a terminal information retaining section for retaining terminal information pieces, one for each terminal of each of the plurality of components;
a tentative symbol determining section for determining a tentative symbol, for each said component, having one or more tentative logical terminals in accordance with an instruction of operator input via said input interface;
a tentative symbol arranging section for arranging the tentative symbol determined by said tentative symbol determining section in accordance with an instruction of operator input via said input interface;
a tentative logical terminal selecting section for selecting a tentative logical terminal from the one or more tentative logical terminals of the tentative symbols arranged by said tentative arranging section in accordance with an instruction of operator input via said input interface;
a terminal information selecting section for selecting a terminal information piece from a plurality of the terminal information pieces retained by said terminal information retaining section in accordance with an instruction of operator input via said input interface; and
a symbol determining section for determining the tentative symbol to be the symbol representing each said component by, for each said component, allocating the terminal information piece selected by said terminal information selecting section to the tentative logical terminal selected by said tentative logical terminal selecting section.

16. An interactive design aid apparatus according to claim 15, further comprising a tentative symbol information setting section for setting tentative symbol information concerning the tentative symbol corresponding to each said component and including at least the number of tentative logical terminals of the tentative symbol in accordance with an instruction of operator input via said input interface, wherein said tentative symbol determining section generates the tentative symbol based on the tentative symbol information set by said tentative symbol information setting section.

17. An interactive design aid apparatus according to claim 15, further comprising a tentative symbol retaining section for retaining one or more tentative symbols each corresponding to a component, wherein said tentative symbol determining section extracts a tentative symbol representing one of the plurality of components of the circuit from said tentative symbol retaining section in accordance with an instruction of operator input via said input interface.

18. An interactive design aid apparatus according to claim 15, wherein said symbol determining section deletes one or more tentative logical terminals to which the terminal information piece has not been allocated.

19. An interactive design aid apparatus according to claim 15, wherein said symbol determining section increases the number of tentative logical terminals of the tentative symbol.

20. An interactive design aid apparatus according to claim 15, further comprising a symbol retaining section for retaining one or more symbols representing one or more of the plurality of components, wherein said symbol determining section determines the one or more symbols retained by said symbol retaining section to be the symbol representing the one or more components.

* * * * *

UNITED STATES PATENT AND TRADEMARK OFFICE
CERTIFICATE OF CORRECTION

| | |
|---|---|
| PATENT NO. | : 7,870,526 B2 |
| APPLICATION NO. | : 11/961042 |
| DATED | : January 11, 2011 |
| INVENTOR(S) | : Tsuneo Oka et al. |

It is certified that error appears in the above-identified patent and that said Letters Patent is hereby corrected as shown below:

Title Page Column 1 item 54 (Title), Line 1 before "AID" insert -- DESIGN --.

Column 1, Line 1 before "AID" insert -- DESIGN --.

Signed and Sealed this
Nineteenth Day of April, 2011

David J. Kappos
*Director of the United States Patent and Trademark Office*